United States Patent
Chen et al.

(10) Patent No.: US 9,773,662 B1
(45) Date of Patent: Sep. 26, 2017

(54) METHOD FOR FABRICATING A FINE STRUCTURE

(71) Applicants: TAIWAN SEMICONDUCTOR MANUFACTURING CO., LTD., Hsinchu (TW); NATIONAL TAIWAN UNIVERSITY, Taipei (TW)

(72) Inventors: Miin-Jang Chen, Taipei (TW); Chi-Wen Liu, Hsinchu (TW); Po-Hsien Cheng, Taipei (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 15/173,105

(22) Filed: Jun. 3, 2016

(51) Int. Cl.
| | | |
|---|---|---|
| H01L 21/00 | (2006.01) |
| H01L 21/02 | (2006.01) |
| H01L 21/311 | (2006.01) |
| H01L 29/78 | (2006.01) |
| H01L 29/161 | (2006.01) |
| H01L 29/66 | (2006.01) |

(52) U.S. Cl.
CPC .... *H01L 21/0228* (2013.01); *H01L 21/02164* (2013.01); *H01L 21/02181* (2013.01); *H01L 21/02183* (2013.01); *H01L 21/02186* (2013.01); *H01L 21/02189* (2013.01); *H01L 21/31116* (2013.01); *H01L 29/161* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | | | |
|---|---|---|---|---|
| 6,297,087 | B1* | 10/2001 | Koffler | H01L 27/10867 257/E21.653 |
| 9,362,179 | B1* | 6/2016 | Cheng | H01L 21/823821 |
| 2005/0202680 | A1* | 9/2005 | Yeh | H01L 21/28123 438/694 |
| 2006/0068575 | A1* | 3/2006 | Gluschenkov | H01L 21/28079 438/585 |
| 2010/0093179 | A1* | 4/2010 | Hori | H01L 21/02238 438/723 |
| 2011/0065276 | A1* | 3/2011 | Ganguly | H01L 21/0223 438/694 |
| 2015/0126008 | A1* | 5/2015 | Paul | H01L 21/823431 438/283 |
| 2015/0140787 | A1* | 5/2015 | Zhang | H01L 21/30604 438/478 |

(Continued)

OTHER PUBLICATIONS

Y. Wang, Infrared characterization of hafnium oxide grown by atomic layer deposition using ozone as the oxygen precursor; Appl. Phys. Lett. 90, 022906 (2007).*

*Primary Examiner* — Charles Garber
*Assistant Examiner* — Alia Sabur
(74) *Attorney, Agent, or Firm* — McDermott Will & Emery LLP (57) ABSTRACT

In a method for fabricating a fine structure, a metal oxide layer is formed by using an atomic layer deposition over a substrate, and the metal oxide layer is removed. An interfacial oxide layer is formed between the metal oxide layer and the substrate. The interfacial oxide layer is an oxide of an element constituting the substrate, and the interfacial oxide layer is removed.

20 Claims, 10 Drawing Sheets

(56) References Cited

U.S. PATENT DOCUMENTS

2016/0035581 A1\* 2/2016 Posseme ............... H01L 21/306
   438/705
2016/0071933 A1\* 3/2016 Maitrejean .......... H01L 29/1054
   257/401

\* cited by examiner

METHOD FOR FABRICATING A FINE STRUCTURE

TECHNICAL FIELD

The disclosure relates to a pattern forming method, and more particularly to a pattern forming method for a semiconductor device.

BACKGROUND

With a decrease of dimensions of semiconductor devices, a precise control of critical dimensions (CDs) of patterns to be fabricated on a semiconductor substrate has become critical. It is sometime difficult to control an etching amount at a nano-meter order level in a conventional dry etching or wet etching. Accordingly, it has been required to provide an etching method to more precisely control the etching amount.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-10D show various stages of exemplary sequential pattern formation methods according to various embodiments of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Figure 1:
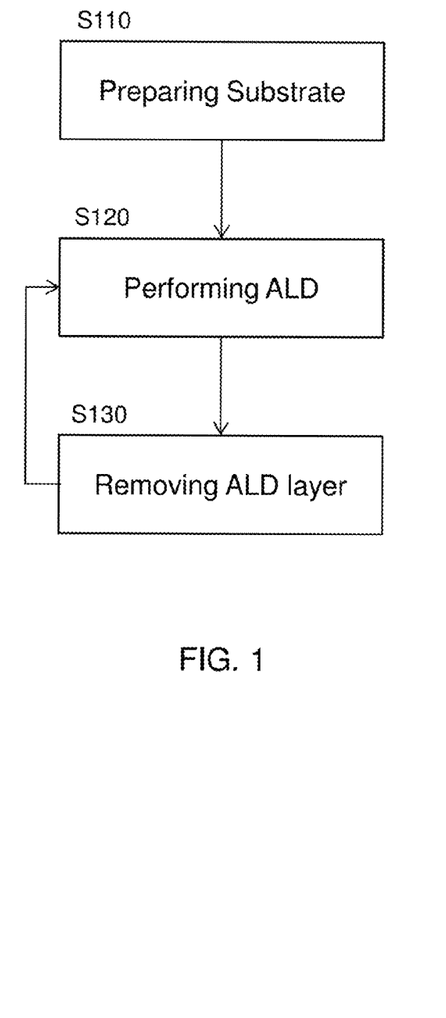
FIG. 1 shows an exemplary flow chart of a pattern forming method according to one embodiment of the present disclosure.

FIG. 1 shows an exemplary flow chart of a pattern forming method according to one embodiment of the present disclosure. It is understood that additional operations can be provided before, during, and after processes shown by FIG. 1, and some of the operations described below can be replaced or eliminated, for additional embodiments of the method.

In S110, a substrate is provided. In this disclosure, a substrate does not necessarily mean a wafer. Rather, a substrate refers to an underlying layer, and may be the upper portion of the wafer or one or more layers formed on the wafer. At least a surface portion of the substrate includes at least one of Si, SiGe, Ge, SiC and a Group III-V semiconductor. In one embodiment, the substrate is made of Si, poly Si or amorphous Si.

In S120, a metal oxide (dielectric) layer is formed by performing an atomic layer deposition (ALD). The metal oxide layer includes one of aluminum oxide, hafnium oxide, zirconium oxide, titanium oxide, tantalum oxide and gallium oxide. In some embodiments, the metal oxide layer includes silicon oxide or germanium oxide.

In ALD for metal oxide formation, a precursor (gas) for an oxygen source and a precursor for a metal element are alternately and repeatedly provided on a surface of the substrate.

The source gas for oxygen includes at least one of $H_2O$ (water vapor), ozone gas or oxygen gas. The source gas for metal element includes: trimethylaluminum for aluminum; tetrakis(diethylamido)hafnium(IV) or tetrakis(dimethylamido)hafnium(IV) for hafnium; tetrakis(ethylmethylamido)zirconium(IV) or tetrakis(dimethylamido)zirconium(IV) for zirconium; tetrakis(diethylamido)titanium(IV) or titanium (IV) chloride for titanium; and tris(dimethylamido)gallium (III) or triethylgallium for gallium. The source gas for silicon includes silane, disilane or dichlorosilane, and the source gas for germanium includes germane, digermane or trigermane.

A general process of ALD is as follows. A first precursor material (including element A) is vaporized, and the vaporized first precursor material (first precursor gas) gas is provided onto a substrate in a vacuum chamber. In this disclosure element A is oxygen. Molecules of the first precursor gas are absorbed to the surface of a substrate and are decomposed, for example, thermally, thereby creating a mono-atomic layer comprising element A on the surface of the substrate. Then a purge gas is introduced to purge excess source gas. Next, a second precursor gas (reactive gas) including element B is introduced onto the surface of the wafer such that the second precursor gas (element B) reacts with the mono-atomic layer of element A. In this disclosure, element B is metal element. A purge gas is again introduced to purge excess reactive gas, and a single layer of a compound of a reaction product of elements A and B is formed. The operations of providing the first precursor material, purging, providing the second precursor material and purging are repeated to form a thin film of the compound with a desired thickness. The ALD method has a feature that a layer can be conformally grown over a projection or into a small hole/recess with a high aspect ratio because the layer is grown for each mono-atomic layer. In some embodiments, a plasma of the precursor is generated to supply the energy to cause decomposure of the precursor gases. The order of suppling the first precursor gas and the second precursor gas may be interchanged.

In some embodiments, about 10 to about 20 ALD cycles are performed to form the metal oxide layer. During the ALD cycles of deposition of the metal oxide layer, an interfacial oxide layer is formed between the metal oxide layer and the substrate by consuming elements in the substrate. The interfacial oxide layer is an oxide of an element constituting the substrate. For example, when at least a surface portion of the substrate includes Si, the interfacial oxide layer is silicon oxide. Thus, the interfacial oxide layer is formed "in" the surface portion of the substrate.

The thickness of the interfacial oxide layer is in a range from about 0.5 nm to about 5 nm in some embodiments, and is in a range from about 1 nm to about 3 nm in other embodiments. The thickness of the interfacial oxide layer is very uniform. The variation of the thickness of the interfacial oxide layer is less than about 5%.

The thickness of the interfacial oxide layer depends upon the number of ALD cycles and the ALD conditions such as deposition temperature.

The thickness of the interfacial oxide layer increases with an increase in the number of ALD cycles. However, the thickness of the interfacial oxide layer does not substantially increase after a certain number of ALD cycles.

The thickness of the interfacial oxide layer increases with an increase of the deposition temperature. The ALD deposition temperature (substrate temperature) is in a range from about 150° C. to about 400° C. in some embodiments. The deposition temperature is adjusted based on the metal material of the metal oxide layer. The deposition temperature increases in the order of Al, Ti, Hf, Zr and Ga (the deposition temperature of gallium oxide is highest). For example, the deposition temperature for aluminum oxide is in a range from about 150° C. to about 300° C. and the deposition temperature for gallium oxide is in a range from about 200° C. to about 500° C., in some embodiments.

In S130 of FIG. 1, the deposited ALD layer and the interfacial oxide layer are removed, by using suitable dry etching and/or wet etching. In case of wet etching, in certain embodiments, a dilute hydrofluoric acid solution with 6:1 volume ratio of 40% ammonium fluoride (NH$_4$F) in water to 49% hydrofluoric acid (HF) in water is used. By this etching, the interfacial oxide layer, which is formed in the surface portion of the substrate, is removed, thereby etching the surface portion of the substrate.

By repeating S120 and S130, the substrate is etched in a step-by-step basis with high uniformity, accuracy and controllability. The total etching amount can be adjusted by the number of cycles of S120 and S130.

Figure 2:
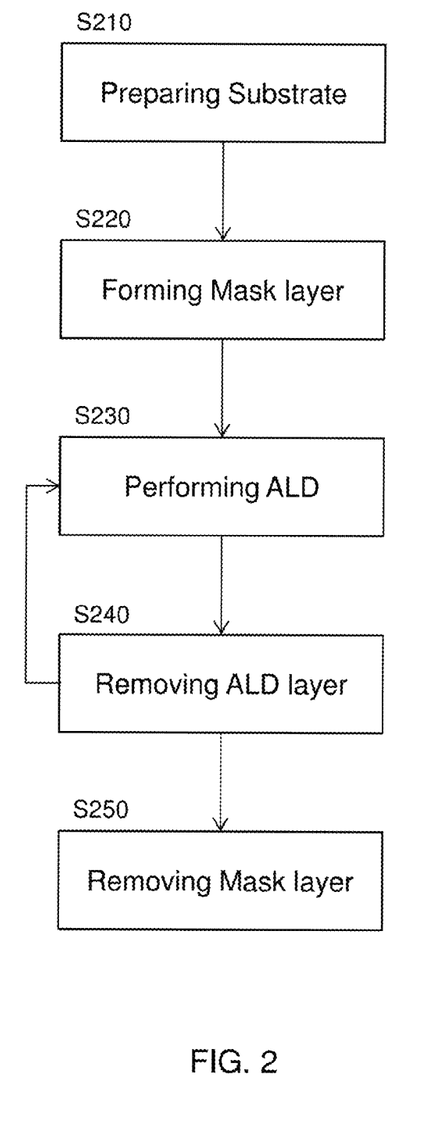
FIG. 2 shows an exemplary flow chart of a pattern forming method according to another embodiment of the present disclosure.

FIG. 2 shows an exemplary flow chart of a pattern forming method according to another embodiment of the present disclosure.

S210 is the same as S110 of FIG. 1. In S210, a mask (or a protective) layer is formed over the substrate. The mask layer covers an area of the substrate not to be etched and an opening over an area of the substrate to be etched. Plural areas may be covered and plural openings may be provided.

The mask layer is made of, for example, at least one of metal nitride, such as SiN, TiN or WN, platinum and tungsten, in some embodiments. In other embodiments, Ge or SiGe is used as the mask layer.

Similar to S120 and S130, the ALD deposition and removal of the metal oxide and the interfacial oxide layer are performed in S230 and S240. By repeating S230 and S240, the substrate is etched in a step-by-step basis, while the area of the substrate covered by the mask layer is not etched.

In S250, the mask layer is removed by suitable method, such as dry etching and/or wet etching. In some embodiments, the mask layer is not removed.

FIGS. 3A-10D show various stages of an exemplary sequential pattern formation method according to various embodiments of the present disclosure. In FIGS. 3A-10D, the material, configurations, operations or processes the same as or similar to those described with FIGS. 1 and 2 may be employed, and the detailed explanation thereof may be omitted. Similarly, the material, configurations, operations or processes described with one or more embodiments of FIGS. 3A-10D may be employed in other embodiments of FIGS. 3A-10D.

FIGS. 3A-3D show various stages of an exemplary sequential pattern formation method according to one embodiment of the present disclosure. FIGS. 3A-3D correspond to S220-S250 of FIG. 2 without repeating S230 and S240.

Figure 3A:
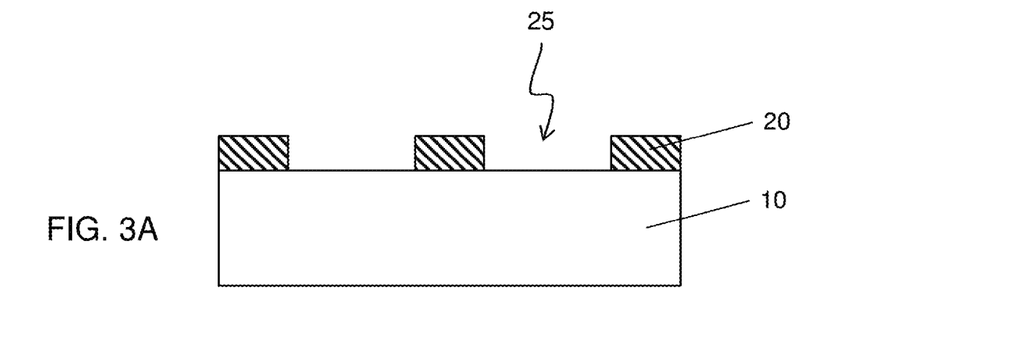

In FIG. 3A, a mask layer 20 is formed over a substrate 10. In some embodiments, the substrate is a Si substrate. In certain embodiments, a silicon-on-insulator (SOI) is used. The mask layer 20 has two openings 25 over areas of the substrate 10 to be etched.

Figure 3B:
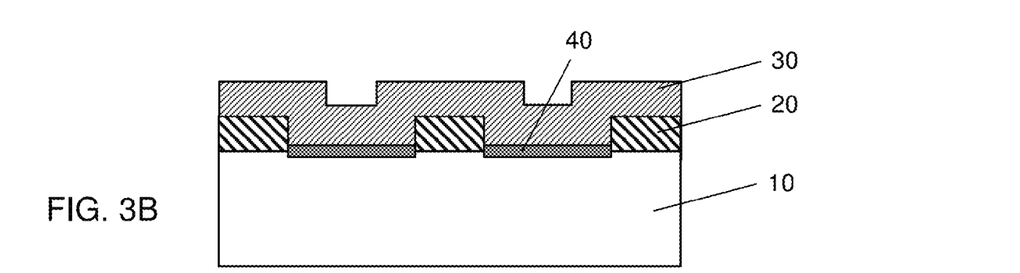

In FIG. 3B, ALD cycles are performed to form the metal oxide layer 30 and interfacial oxide layer 40.

Figure 3C:
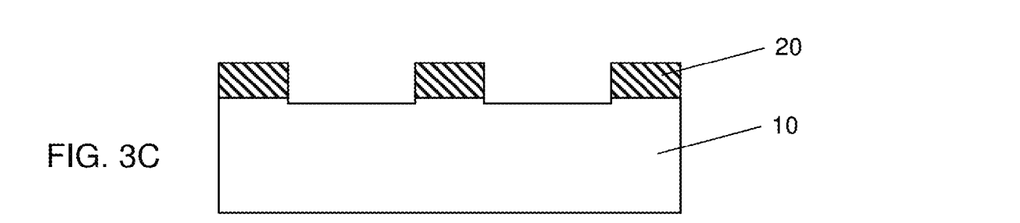
Figure 3D:
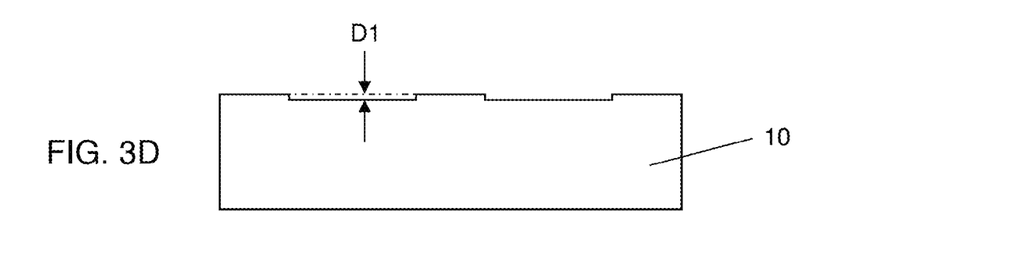

In FIG. 3C, the metal oxide layer 30 and the interfacial oxide layer 40 are removed. In FIG. 3D, the mask layer 20 is also removed.

As shown in FIG. 3D, the surface of the substrate 10 corresponding to the openings 25 is etched with a depth D1. The depth D1 is in a range from about 0.5 nm to about 5 nm in some embodiments, and is in a range from about 1 nm to about 3 nm in other embodiments.

Since the interfacial oxide layer is formed in vertical and horizontal directions at the surface of the substrate, the etching of the substrate by this technique is generally isotropic. The etching rate of the substrate by one cycle of ALD deposition and removal is in a range from about 0.5 nm/cycle to about 2.0 nm/cycle in some embodiments, and is in a range from about 0.8 nm/cycle to about 1.2 nm/cycle in other embodiments.

Figure 4A:
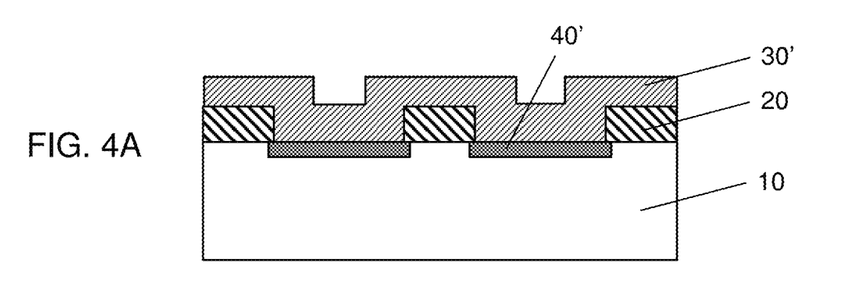
Figure 4B:
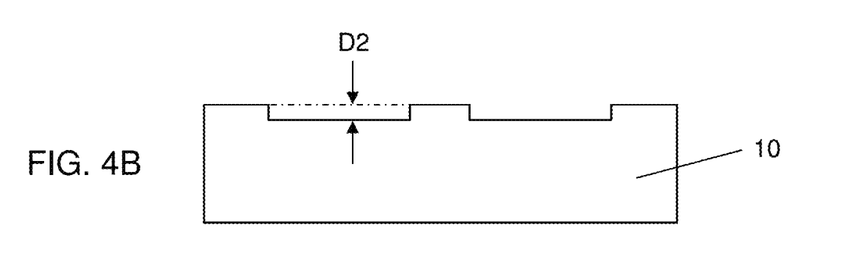

FIGS. 4A and 4B show various stages of an exemplary sequential pattern formation method according to one embodiment of the present disclosure. FIGS. 4A and 4B show the case where S230 and S240 are repeated.

After the metal oxide layer 30 and the interfacial oxide layer 40 are removed in FIG. 3C, the next metal oxide layer 30' is formed by a second ALD cycle. By the second ALD cycle, new interfacial oxide layer 40' is formed as shown in FIG. 4A.

After the metal oxide layer 30' and new interfacial oxide layer 40' are removed, the structure of FIG. 4B is obtained. The depth D2 is substantially twice the depth D1 if the ALD conditions are the same between the first ALD cycles and the second ALD cycles. By further repeating the deposition and removal, a desired etching depth can be obtained.

FIGS. 5A-5D show various stages of an exemplary sequential pattern formation method according to one embodiment of the present disclosure. In this embodiment, the ALD deposition is performed over a convex structure formed over a substrate. The convex structure includes a fin structure for a fin field effect transistor, a bump and a protrusion.

Figure 5A:
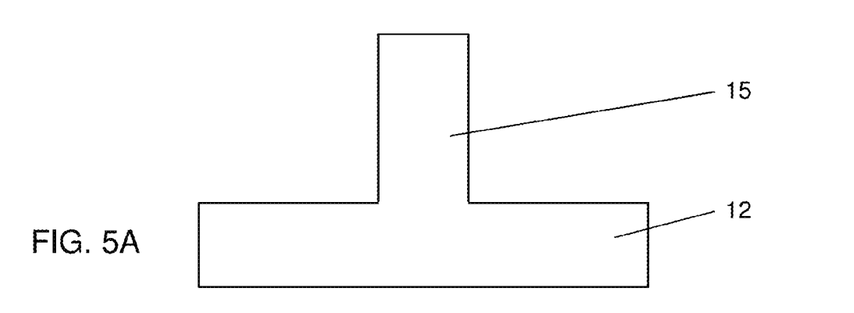

As shown in FIG. 5A, a fin structure 15 is disposed over a substrate 12. The fin structure 15 may be formed by trench etching the substrate 12, and thus the fin structure 15 and the substrate are made of the same material. In other embodiments, the fin structure 15 and the substrate 12 are made of different materials. In this embodiment, the fin structure 15 and the substrate 12 are made of Si.

Figure 5B:
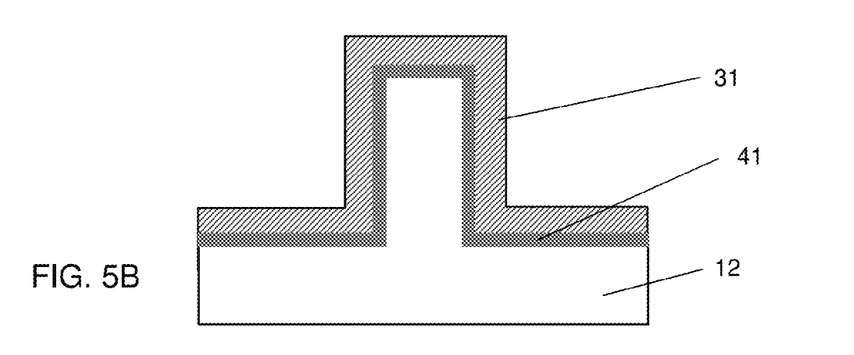

In FIG. 5B, ALD cycles are performed to form the metal oxide layer 31 and interfacial oxide layer 41 over the fin structure 15 and the substrate 12.

Figure 5C:
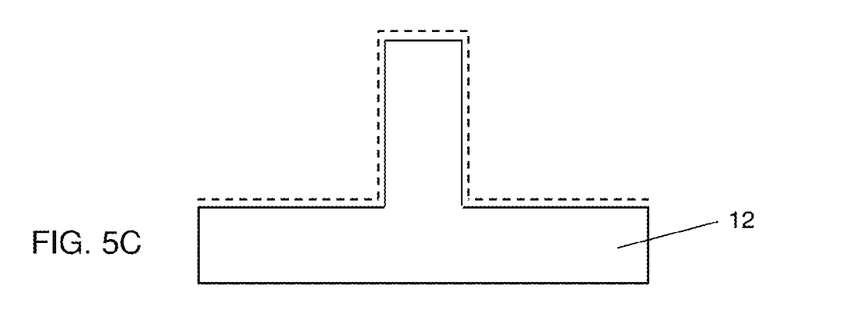
Figure 5D:
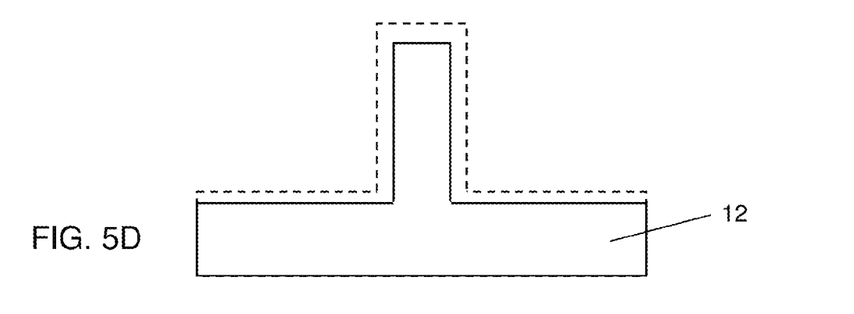

In FIG. 5C, the metal oxide layer 31 and the interfacial oxide layer 41 are removed. After repeating the deposition and removal, the structure shown in FIG. 5D is obtained. By using this technique, it is possible to more precisely control the dimensions (e.g., width and/or height) of the fin structure 15.

FIGS. 6A-6D show various stages of an exemplary sequential pattern formation method according to one embodiment of the present disclosure. In this embodiment, a mask layer is formed over the upper surface of a convex structure.

Figure 6A:
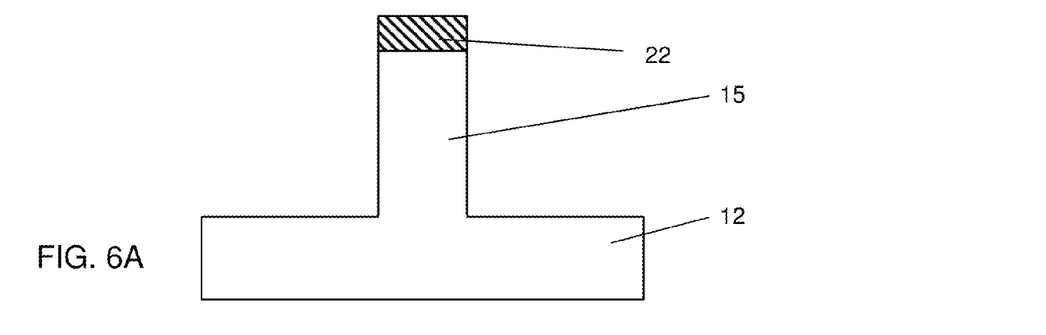

As shown in FIG. 6A, a fin structure 15 is disposed over a substrate 12. The fin structure 15 includes a mask layer 22 on the top of the fin structure 15. The mask layer 22 may be a hard mask used to etch the substrate to form the fin structure, and may include silicon nitride.

Figure 6B:
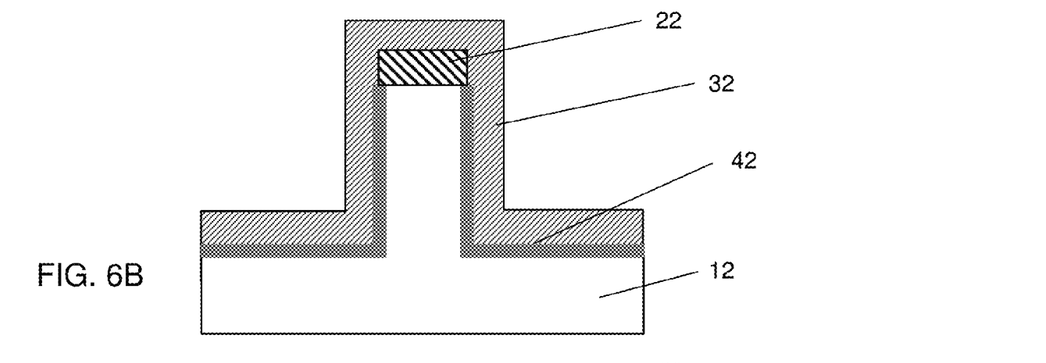

In FIG. 6B, ALD cycles are performed to form the metal oxide layer 32 and interfacial oxide layer 42 over the fin structure 15 and the substrate 12.

Figure 6C:
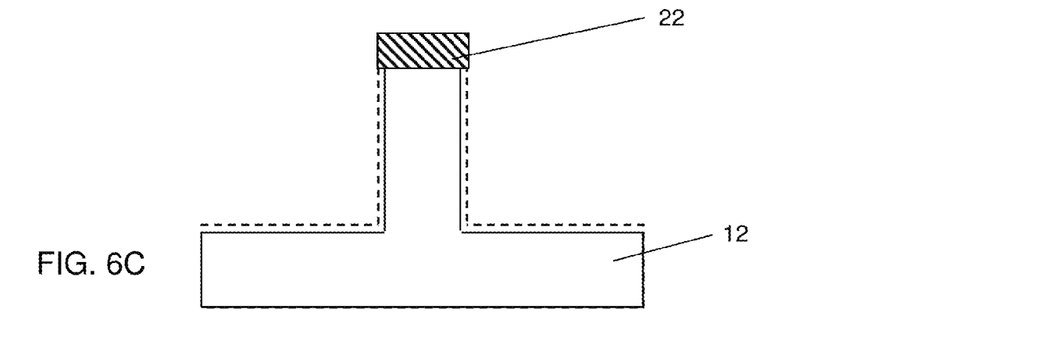
Figure 6D:
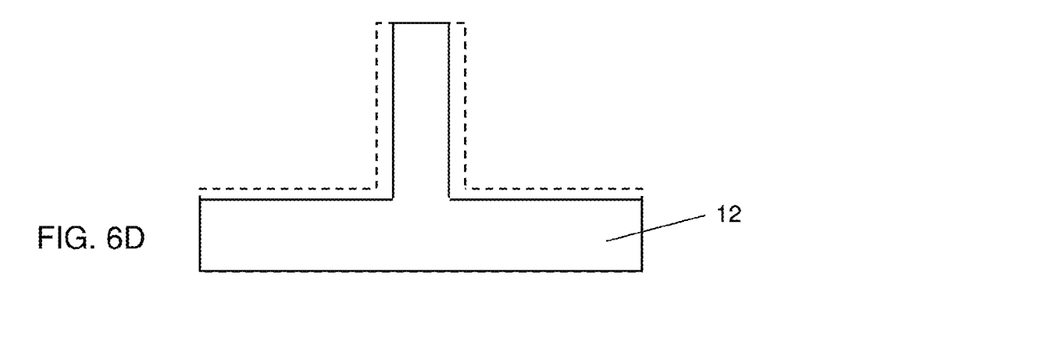

In FIG. 6C, the metal oxide layer 32 and the interfacial oxide layer 42 are removed. After repeating the deposition and removal of the ALD layers and removing the mask layer 22, the structure shown in FIG. 6D is obtained. Since the top of the fin structure 15 is covered by the mask layer 22, the height of the fin structure is not reduced. By using this technique, it is possible to more precisely control the dimensions (e.g., width) of the fin structure.

FIGS. 7A-7D show various stages of an exemplary sequential pattern formation method according to one embodiment of the present disclosure. In this embodiment, a mask layer is formed over the upper surface of the substrate.

Figure 7A:
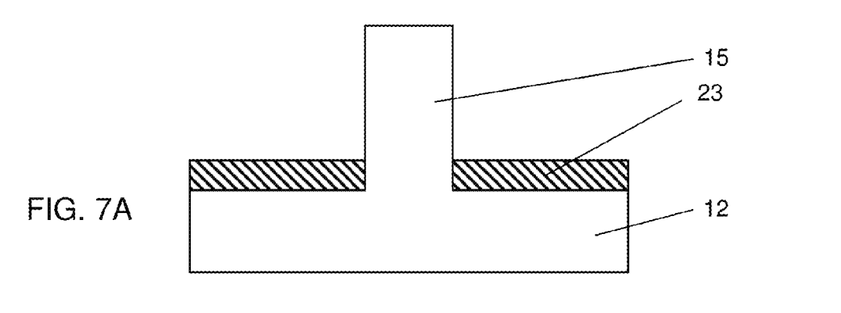

As shown in FIG. 7A, a fin structure 15 is disposed over a substrate 12. The upper surface of the substrate 12 other than the fin structure 15 is covered by a mask layer 23.

Figure 7B:
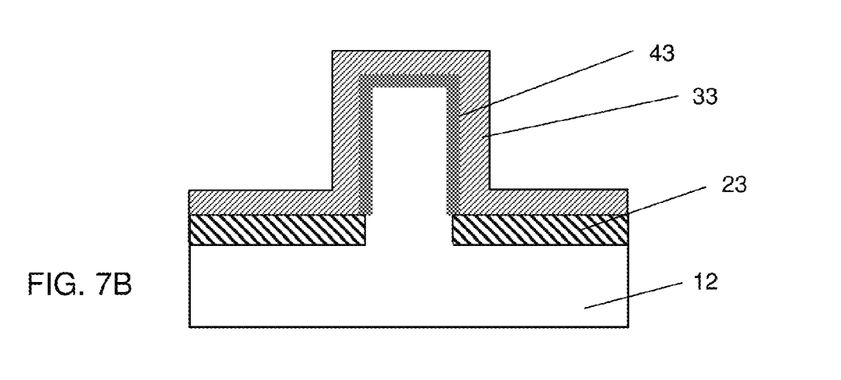

In FIG. 7B, ALD cycles are performed to form the metal oxide layer 33 and interfacial oxide layer 43 over the fin structure 15.

Figure 7C:
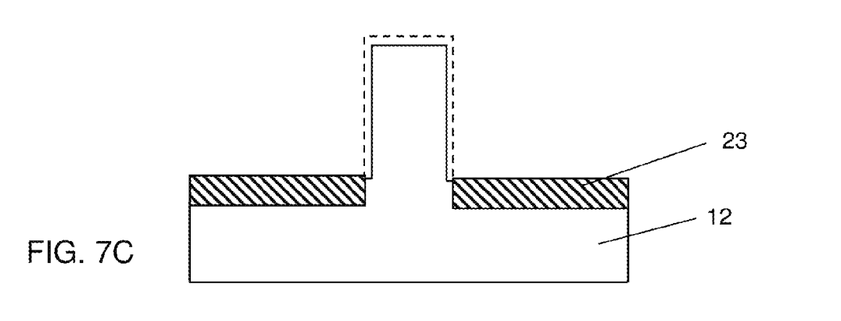
Figure 7D:
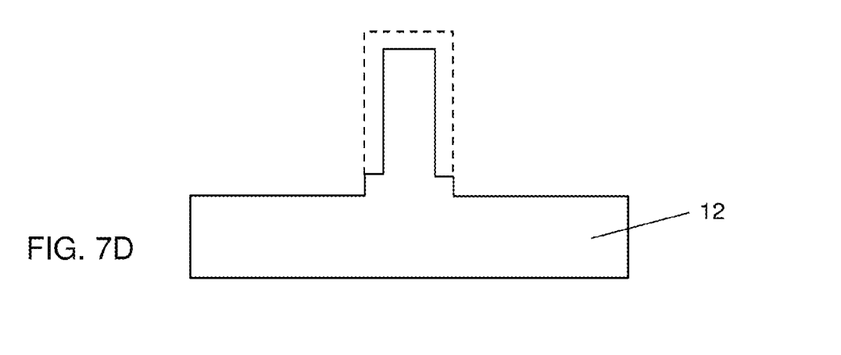

In FIG. 7C, the metal oxide layer 33 and the interfacial oxide layer 43 are removed. After repeating the deposition and removal of the ALD layers and removing the mask layer 23, the structure shown in FIG. 7D is obtained. Since the surface of the substrate 12 is covered by the mask layer 23, only the fin structure is etched. By using this technique, it is possible to more precisely control the dimensions (e.g., width and/or height) of the fin structure.

FIGS. 8A-8D show various stages of an exemplary sequential pattern formation method according to one embodiment of the present disclosure. In this embodiment, mask layers are formed over the top of the concave structure and the upper surface of the substrate.

Figure 8A:
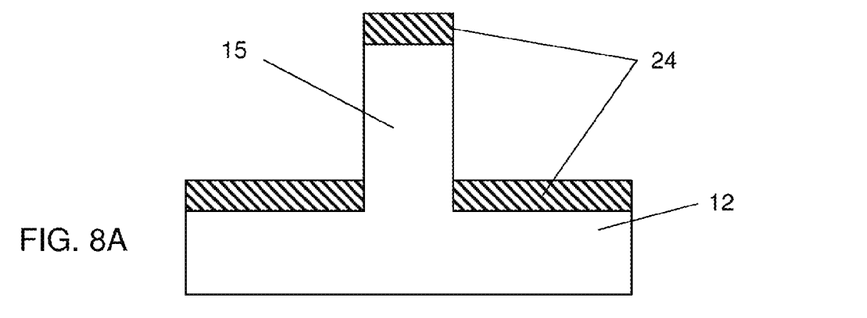

As shown in FIG. 8A, a fin structure 15 is disposed over a substrate 12. The top of the fin structure 15 and the upper surface of the substrate 12 other than the fin structure 15 are covered by mask layers 24.

Figure 8B:
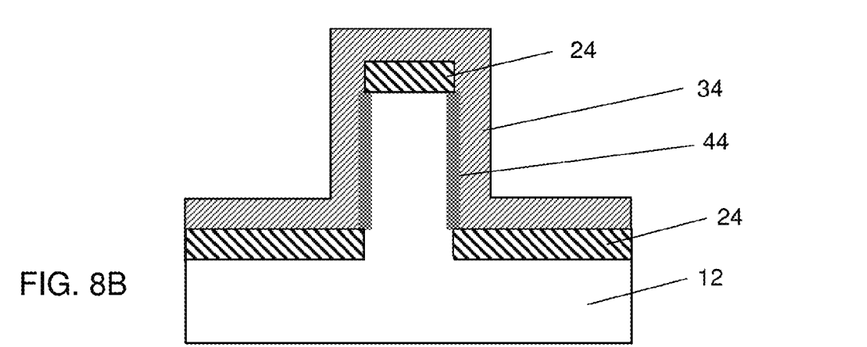

In FIG. 8B, ALD cycles are performed to form the metal oxide layer 34 and interfacial oxide layer 44 over the side surfaces of the fin structure 15.

Figure 8C:
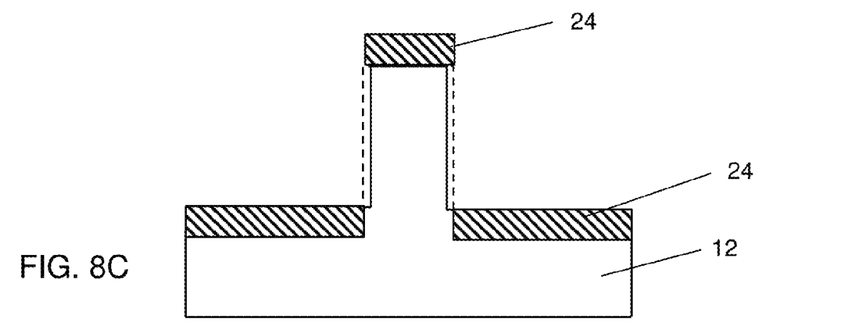
Figure 8D:
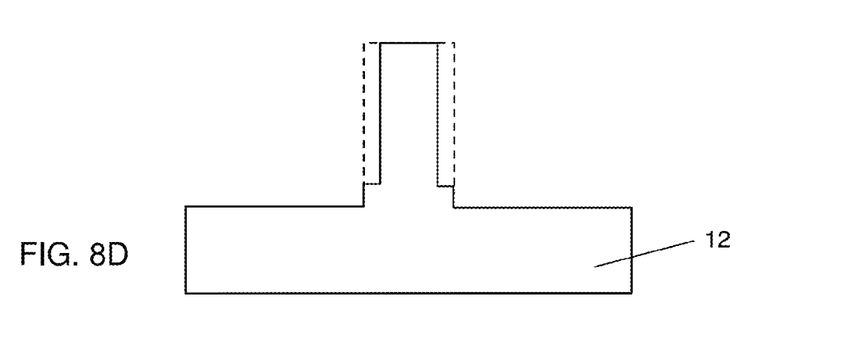

In FIG. 8C, the metal oxide layer 34 and the interfacial oxide layer 44 are removed. After repeating the deposition and removal of the ALD layers and removing the mask layer 24, the structure shown in FIG. 8D is obtained. Since the top of the fin structure 15 and the surface of the substrate 12 are covered by the mask layers 24, only the side surfaces of the fin structure 15 are etched. By using this technique, it is possible to more precisely control the dimensions (e.g., width) of the fin structure.

FIGS. 9A-9D show various stages of an exemplary sequential pattern formation method according to one embodiment of the present disclosure. In this embodiment, the substrate or the convex structure includes two or more materials.

Figure 9A:
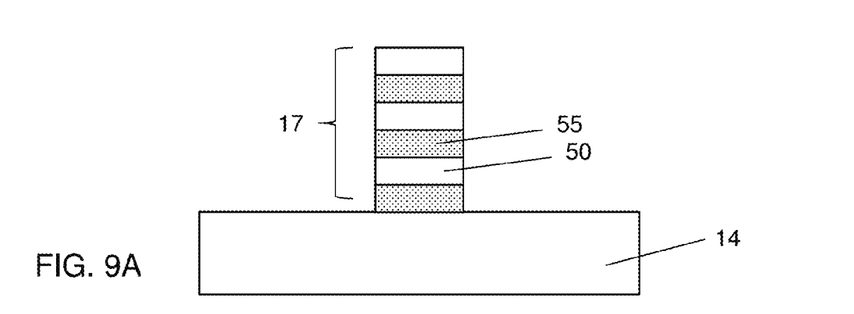

As shown in FIG. 9A, a fin structure 17 is disposed over a substrate 14. The fin structure 17 is made of a stack of one or more layers of different materials. In some embodiments, the fin structure 17 is made of a stack of one or more layers of $Si_xGe_{1-x}$ 50 and one or more layers of $Si_yGe_{1-y}$ 55, where $0<x\leq1, 0\leq y<1$ and $x>y$. In certain embodiments, the layer 50 is Si and the layer 55 is $Si_zGe_{1-z}$, where $0.2\leq z\leq0.8$ (hereinafter, SiGe), and the substrate 14 is Si. The thickness of the layers 50 and layer 55 may be the same or may be different from each other. Further, the thickness of the layers 50 may vary in the fin structure 17, and/or the thickness of the layers 55 may vary in the fin structure 17. In some embodiments, the closer to the substrate the layer 50 (55) is, the greater the thickness of the layer 50 (55) becomes. In other embodiments, the closer to the substrate the layer 50 (55) is, the smaller the thickness of the layer 50 (55) becomes. In other embodiments, the closer to the substrate the layer 50 and 55 are, the greater the thickness of the layer 50 becomes and the smaller the thickness of the layer 55 becomes. Further, in certain embodiments, the closer to the substrate the layers 50 and 55 are, the smaller the thickness of the layer 50 becomes and the greater the thickness of the layer 55 becomes.

The fin structure 17 can be formed by alternately depositing a Si layer and a $Si_zGe_{1-z}$ layer over the substrate 14, and trench etching the deposited stacked layers.

Figure 9B:
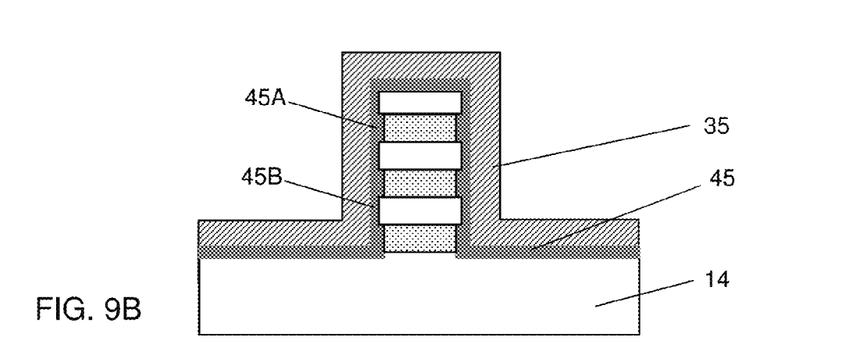

In FIG. 9B, ALD cycles are performed to form the metal oxide layer 35 and interfacial oxide layer 45 over the substrate 14 and interfacial oxide layers 45A and 45B over the fin structure 15. The interfacial oxide layer 45A is an oxide of the element(s) constituting the layer 50, and the interfacial oxide layer 45B is an oxide of the element(s) constituting the layer 55. When the layer 50 is Si and the layer 55 is SiGe, the interfacial oxide layer 45A is silicon oxide, and the interfacial oxide layer 45B is silicon-germanium oxide. Generally, since SiGe is more easily oxidized than Si, the thickness of the interfacial oxide layer 45B is greater than the thickness of interfacial oxide layer 45A.

Figure 9C:
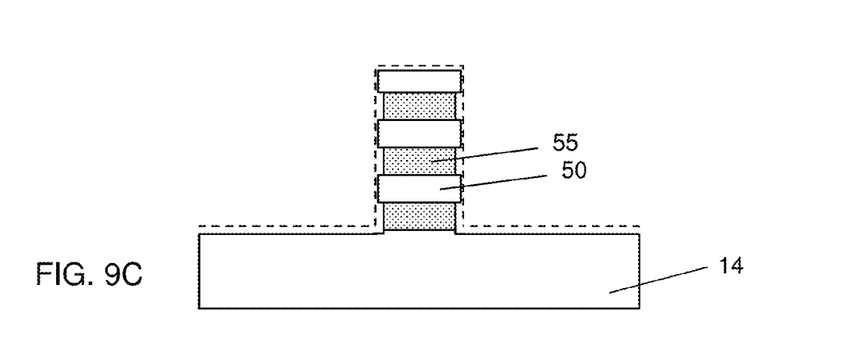
Figure 9D:
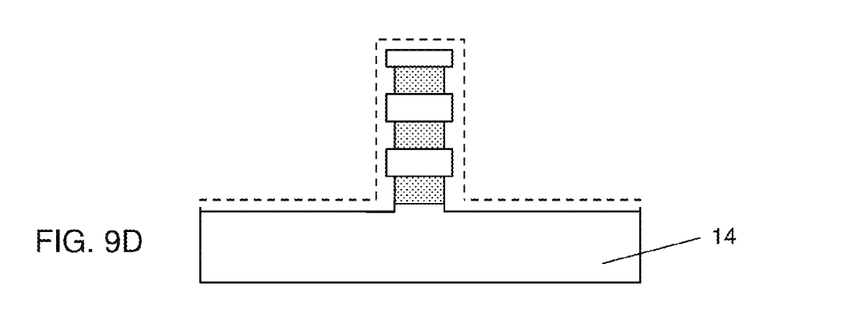

In FIG. 9C, the metal oxide layer 35 and the interfacial oxide layers 45, 45A and 45B are removed. After repeating the deposition and removal of the ALD layers, the structure shown in FIG. 9D is obtained. By using this technique, it is possible to more precisely control the dimensions (e.g., width and/or height) of the fin structure, and to make the different shape/size of the layers of the fin structure 17. In certain embodiments, it is possible to make a nano-wire by completely removing the layer 55 or a psuedo nano-wire of layers 50.

It is possible to employ one or more the mask layers described in FIGS. 6A-8D to the fin structure 17.

FIGS. 10A-10D show various stages of an exemplary sequential pattern formation method according to one embodiment of the present disclosure. In this embodiment, the ALD deposition is performed over a concave structure formed in a substrate or the underlying layer. The concave structure includes an opening, a hole, a groove or a recess.

Figure 10A:
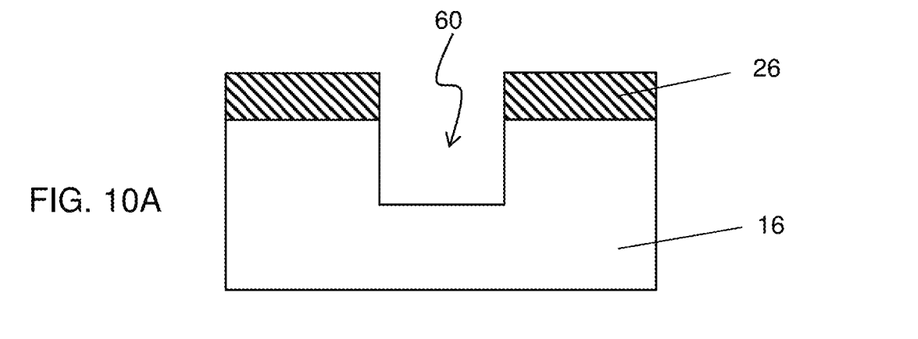

As shown in FIG. 10A, an opening 60 is formed in a substrate (or an underlying layer) 16. The substrate 16 is made of Si, poly Si or amorphous Si in some embodiments.

In this embodiment, the opening 60 is formed by using a mask layer 26 as an etching mask. In other embodiments, the mask layer 26 is removed before the ALD deposition and thus not used.

Figure 10B:
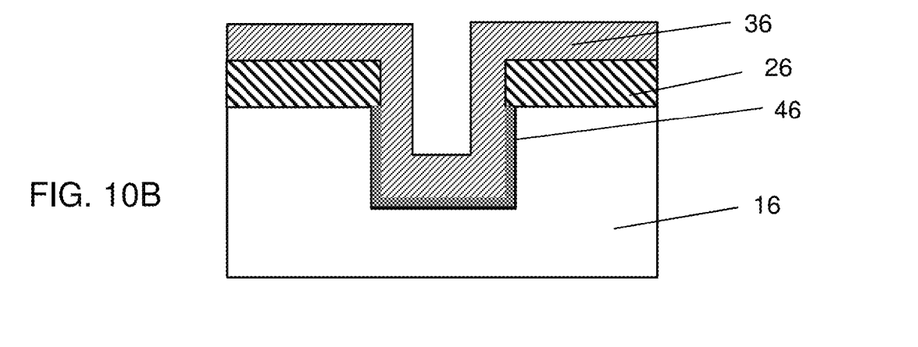

In FIG. 10B, ALD cycles are performed to form the metal oxide layer 36 and interfacial oxide layer 46 over the side surfaces and the bottom surface of the opening 60.

Figure 10C:
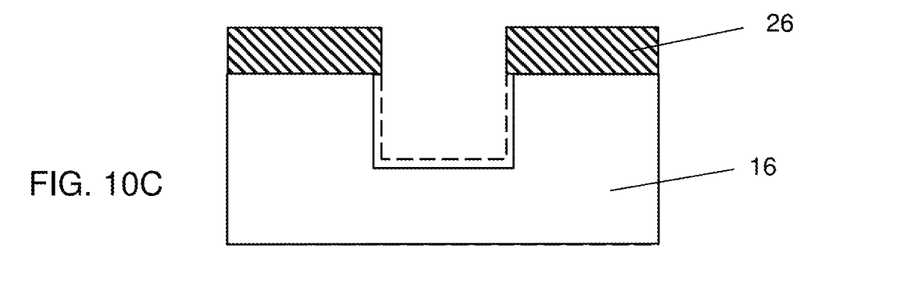
Figure 10D:
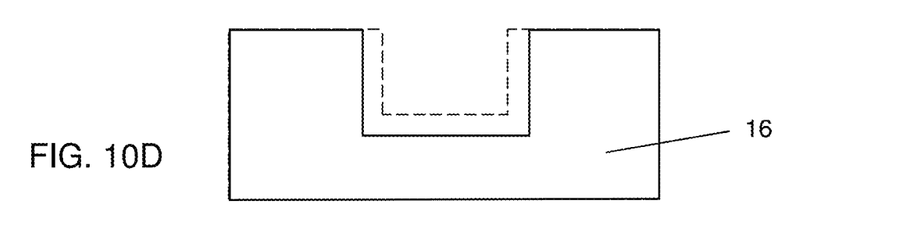

In FIG. 10C, the metal oxide layer 36 and the interfacial oxide layer 46 are removed. After repeating the deposition and removal of the ALD layers and removing the mask layer 26, the structure shown in FIG. 10D is obtained. By using this technique, it is possible to more precisely control the dimensions (e.g., depth) of the opening.

Figure 11:
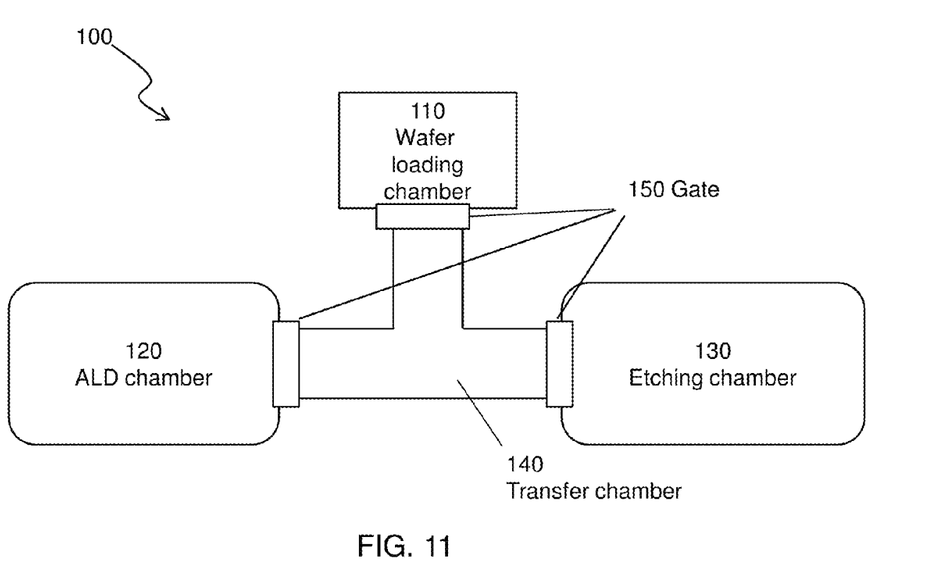
FIG. 11 shows an exemplary schematic view of an integrated apparatus for an ALD operation and an etching operation.

FIG. 11 shows an exemplary schematic view of an integrated apparatus for an ALD operation and an etching operation.

The integrated apparatus 100 includes, for example, a wafer loading chamber 110, an ALD chamber 120, an etching chamber 130 and a transfer chamber 140. The gates 150 are provided between the transfer chamber 140 and chambers 110-130. The apparatus 100 also includes a vacuum pumping system, an electronic controller (e.g., computer) and a wafer transfer mechanism (not shown).

The ALD chamber 120 may include two or more sub-chambers for a first precursor and a second precursor, respectively. The etching chamber 130 may include a dry etching system or a wet etching system.

The wafer to be processed is loaded from the wafer loading chamber 110 and repeatedly transferred between the ALD chamber 120 and the etching chamber 130 for the operations as described with FIGS. 1-10D. By using the integrated apparatus 100, it is possible to more efficiently process the wafer.

The various embodiments or examples described herein offer several advantages over the existing art. For example, by repeating the ALD deposition and removal of the formed oxide layers, it is possible to more precisely control the dimensions of the structure to be etched disposed over a substrate.

It will be understood that not all advantages have been necessarily discussed herein, no particular advantage is required for all embodiments or examples, and other embodiments or examples may offer different advantages.

According to one aspect of the present disclosure, in a method for fabricating a fine structure, a metal oxide layer is formed by using an atomic layer deposition over a substrate, and the metal oxide layer is removed. An interfacial oxide layer is formed between the metal oxide layer and the substrate. The interfacial oxide layer is an oxide of an element constituting the substrate, and the interfacial oxide layer is removed.

According to another aspect of the present disclosure, in a method for fabricating a fine structure, a metal oxide layer is formed by using an atomic layer deposition over a convex structure formed over a substrate, and the metal oxide layer is removed. An interfacial oxide layer is formed between the metal oxide layer and the convex structure. The interfacial oxide layer is an oxide of an element constituting the convex structure, and the interfacial oxide layer is removed.

In accordance with yet another aspect of the present disclosure, in a method for fabricating a fine structure, a metal oxide layer is formed by using an atomic layer deposition over an underlying layer having a concave structure formed in the underlying layer, and the metal oxide layer is removed. An interfacial oxide layer is formed between the metal oxide layer and the concave structure. The interfacial oxide layer is an oxide of an element constituting the underlying layer, and the interfacial oxide layer is removed.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

We claim:

1. A method for fabricating a fine structure, comprising:
forming a metal oxide layer by using an atomic layer deposition (ALD) over a substrate; and
removing the metal oxide layer, wherein:
an interfacial oxide layer is formed between the metal oxide layer and the substrate during the formation of the metal oxide layer by using the ALD by consuming part of a material of the substrate,
the interfacial oxide layer is oxide of an element constituting the substrate, which is a different oxide than the metal oxide layer,
the method further comprises removing the interfacial oxide layer, and
the metal oxide layer includes one of aluminum oxide, zirconium oxide, titanium oxide, tantalum oxide and gallium oxide.

2. The method of claim 1, wherein at least a surface portion of the substrate made of at least one of SiGe, Ge, SiC and a Group III-V semiconductor.

3. The method of claim 1, wherein:
at least a surface portion of the substrate includes Si, and
the interfacial oxide layer is silicon oxide.

4. The method of claim 1, wherein the metal oxide layer and interfacial oxide layer are removed by wet etching.

5. The method of claim 1, wherein the metal oxide layer and interfacial oxide layer are removed by dry etching.

6. The method of claim 1, wherein:
a part of a surface of the substrate is covered by a protective layer made of a different material than the substrate, and
the metal oxide layer and the interfacial oxide layer are not formed on the part of a surface of the substrate covered by the protective layer.

7. The method of claim 6, wherein the protective layer made of at least one of Ge, SiGe, TiN, WN, platinum and tungsten.

8. The method of claim 1, wherein the forming the metal oxide layer and the removing the metal oxide layer and the interfacial oxide layer are repeated.

9. A method for fabricating a fine structure, comprising:
forming a metal oxide layer by using an atomic layer deposition (ALD) over a convex structure formed over a substrate; and
removing the metal oxide layer, wherein:
an interfacial oxide layer is formed between the metal oxide layer and the convex structure during the formation of the metal oxide layer by using the ALD by consuming part of a material of the convex structure, the interfacial oxide layer is oxide of an element constituting the convex structure, which is a different oxide than the metal oxide layer, the method further comprises removing the interfacial oxide layer, and the metal oxide layer includes one of aluminum oxide, zirconium oxide, titanium oxide, tantalum oxide and gallium oxide.

10. The method of claim 9, wherein the convex structure is a fin structure to be used for a fin field effect transistor.

11. The method of claim 10, wherein:
the fin structure is made of Si, and
the interfacial oxide layer is silicon oxide.

12. The method of claim 10, wherein:
a part of a surface of the substrate and a part of the fin structure are covered by a protective layer made of a different material than the fin structure and the substrate, and
the metal oxide layer and the interfacial oxide layer are not formed on the part of the surface of the substrate and the part of the fin structure covered by the protective layer.

13. The method of claim 12, wherein the protective layer is made of at least one of Ge, SiGe, TiN, WN, platinum and tungsten.

14. The method of claim 10, wherein the forming the metal oxide layer and the removing the metal oxide layer and the interfacial oxide layer are repeated.

15. The method of claim 1, wherein:
the substrate includes an underlying layer having a concave structure, and
the metal oxide layer is formed over the underlying layer.

16. The method of claim 15, wherein the concave structure is a hole or an opening formed in the underlying layer.

17. The method of claim 9, wherein at least a surface portion of the substrate made of at least one of SiGe, Ge, SiC and a Group III-V semiconductor.

18. A method for fabricating a fine structure, comprising:
forming a metal oxide layer by using an atomic layer deposition (ALD) over a convex structure formed over a substrate; and
removing the metal oxide layer, wherein:
the convex structure is a stack of one or more first semiconductor layers made of $Si_xGe_{1-x}$ and one or more second semiconductor layers made of $Si_yGe_{1-y}$, where $0<x\leq1$, $0\leq y<1$ and $x>y$, which are alternately stacked,
a first interfacial oxide layer is formed between the metal oxide layer and the one or more first semiconductor layers and a second interfacial oxide layer is formed between the metal oxide layer and the one or more second semiconductor layers, during the formation of the metal oxide layer by using the ALD by consuming part of one or more materials of the first and second semiconductor layers,
the first interfacial oxide layer and the second interfacial oxide layer are made of an oxide different from the metal oxide layer, respectively,
a thickness of the first interfacial oxide layer is smaller than a thickness of the second interfacial oxide layer, and
the method further comprises removing the interfacial oxide layer, thereby forming a stacked structure of one or more first semiconductor layers made of the $Si_xGe_{1-x}$ and one or more second semiconductor layers made of the $Si_yGe_{1-y}$, where a width of the one or more first semiconductor layers is greater than a width of the one or more second semiconductor layers.

19. The method of claim 18, wherein the metal oxide layer is made of one of aluminum oxide, hafnium oxide, zirconium oxide, titanium oxide, tantalum oxide and gallium oxide.

20. The method of claim 18, wherein the metal oxide layer is made of one of aluminum oxide, zirconium oxide, titanium oxide, tantalum oxide and gallium oxide.

* * * * *